United States Patent
Kulkarni et al.

(10) Patent No.: US 11,022,966 B1
(45) Date of Patent: Jun. 1, 2021

(54) METHOD OF MODELING E-BEAM PHOTOMASK MANUFACTURING PROCESS USING IMAGE-BASED ARTIFICIAL NEURAL NETWORKS

(71) Applicant: Synopsys, Inc., Mountain View, CA (US)

(72) Inventors: Parikshit Kulkarni, Tampa, FL (US); Dan Hung, Mountain View, CA (US); John Gookassian, Mountain View, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 16/220,910

(22) Filed: Dec. 14, 2018

Related U.S. Application Data

(60) Provisional application No. 62/599,042, filed on Dec. 15, 2017.

(51) Int. Cl.
*G05B 19/418* (2006.01)
*G03F 1/44* (2012.01)
*G03F 1/50* (2012.01)

(52) U.S. Cl.
CPC ......... *G05B 19/41885* (2013.01); *G03F 1/44* (2013.01); *G03F 1/50* (2013.01);
(Continued)

(58) Field of Classification Search
CPC .... G05B 19/41885; G05B 2219/32335; G05B 2219/45031; G05B 2219/32128; G03F 1/44; G03F 1/0015
See application file for complete search history.

(56) References Cited

U.S. PATENT DOCUMENTS 7,676,077 B2 * 3/2010 Kulkarni ........... H01L 21/67005
382/144
8,201,110 B1 * 6/2012 Gu ..................... G03F 7/70441
716/53
(Continued)

FOREIGN PATENT DOCUMENTS

WO  WO 2018/125220 A1   7/2018

OTHER PUBLICATIONS

Choi et al., "Machine learning (ML)-guided OPC using basis functions of Polar Fourier transform," Proc. SPIE 9780, Optical Microlithography XXIX, 97800H, doi: 10.1117/12.2219073, (2016).
(Continued)

*Primary Examiner* — Nha T Nguyen
(74) *Attorney, Agent, or Firm* — Alston & Bird LLP

(57) ABSTRACT

An image-based Artificial Neural Networks (ANN) is used for photomask modeling, which can self-construct an internal representation of the photomask manufacturing process, therefore allowing the modeling process to become unfettered by the limitations of existing mathematical/statistical tools, thus greatly reduces/eliminates the effort needed from tedious and costly model-builders. The ANN model requires mask layout data converted into image pixel form. In ANN training phase a first circuit image and its existing SEM image are modeled via multiple layers of convolution and rectification to pick out the salient features of transformed image. In ANN testing phase, a second circuit image and its existing SEM image are compared and verified to have a difference smaller than the predetermined requirement. The satisfactory second circuit image is converted back from pixel form to circuit layout data for photomask writing.

10 Claims, 11 Drawing Sheets

(52) U.S. Cl.
CPC ............ *G05B 2219/32128* (2013.01); *G05B 2219/32335* (2013.01); *G05B 2219/45031* (2013.01)

(56) References Cited

U.S. PATENT DOCUMENTS

| | | | |
|---|---|---|---|
| 9,915,625 B2* | 3/2018 | Gao | G06T 7/001 |
| 10,360,477 B2* | 7/2019 | Bhaskar | G06K 9/6271 |
| 10,365,225 B1* | 7/2019 | Pandev | G01N 21/84 |
| 10,395,362 B2* | 8/2019 | Gupta | G01N 21/8851 |
| 2007/0143234 A1 | 6/2007 | Huang et al. | |
| 2008/0077907 A1 | 3/2008 | Kulkarni | |
| 2009/0193387 A1* | 7/2009 | Mukherjee | G03F 1/36 716/55 |
| 2015/0323471 A1* | 11/2015 | Sapiens | G01N 21/93 356/73 |
| 2016/0132042 A1 | 5/2016 | Wu | |
| 2016/0327605 A1* | 11/2016 | Pandev | H01L 22/12 |
| 2017/0177997 A1* | 6/2017 | Karlinsky | G06N 3/08 |
| 2017/0191948 A1* | 7/2017 | Gao | G06T 7/001 |
| 2017/0200265 A1* | 7/2017 | Bhaskar | G06T 7/0006 |
| 2017/0270408 A1 | 9/2017 | Shi et al. | |
| 2018/0225817 A1* | 8/2018 | Yu | G03F 1/36 |
| 2018/0314148 A1* | 11/2018 | Tetiker | H01L 21/027 |
| 2018/0322234 A1* | 11/2018 | Cao | G06F 30/367 |
| 2018/0330511 A1* | 11/2018 | Ha | G06K 9/6247 |
| 2018/0341173 A1* | 11/2018 | Li | G03F 1/36 |
| 2019/0287021 A1* | 9/2019 | Chiang | G06K 9/4685 |

OTHER PUBLICATIONS

Klimpel et al., "Model based hybrid proximity effect correction scheme combining dose modulation and shape adjustments", J. Vac. Sci. Technol. B, 29(6):06F315-1-06F315-1, doi: 10.1116/1.3662879, (2011).

Lee et al., "Analysis of dry etch loading effect in mask fabrication," Proc. SPIE 4562, 21st Annual BACUS Symposium on Photomask Technology, doi: 10.1117/12.458341, (2002).

Lin et al., "Model based mask process correction and verification for advanced process nodes," Proc. SPIE 7274, Optical Microlithography XXII, 72742A, doi: 10.1117/12.814362, (2009).

Zach et al., "Neural Network based approach to resist modeling and OPC," Proceedings of SPIE, 5337:670-679, doi: 10.1117/12.535931, (2001).

* cited by examiner

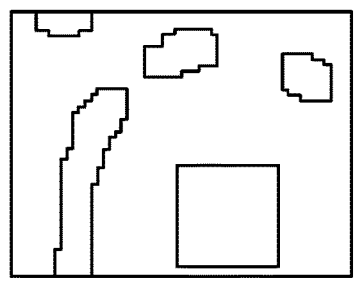
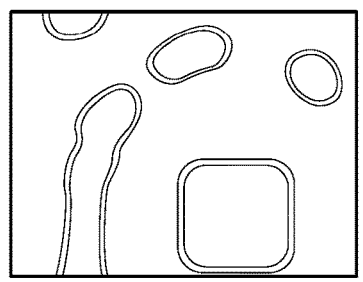
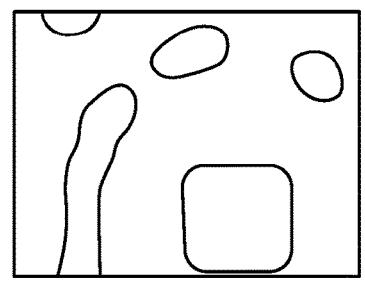
Figure 1a          Figure 1b          Figure 1c
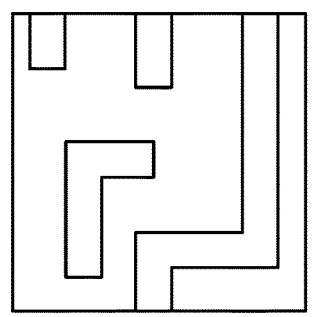
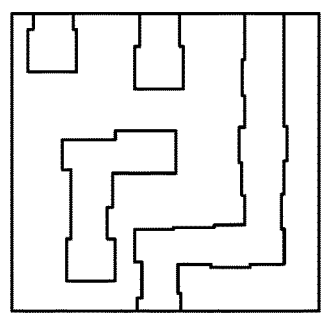
Figure 2a          Figure 2b

METHOD OF MODELING E-BEAM PHOTOMASK MANUFACTURING PROCESS USING IMAGE-BASED ARTIFICIAL NEURAL NETWORKS

CROSS-REFERENCE TO RELATED APPLICATIONS

The present application claims priority to provisional patent application No. 62/599,042 filed on Dec. 15, 2017, the content of which is incorporated herein by reference in its entirety.

TECHNICAL FIELD

The present application relates to integrated circuit fabrication, and in particular, to photomask data modeling for a manufacturing process.

BACKGROUND

Semiconductors ("chips") are produced using processes similar to copying documents made via a copying machine. In this analogy, the copies are wafers containing chips and the original "document" is known as a photomask. The photomask is usually an opaque or partially opaque plate on which patterns are drawn by an electron beam (e-beam) or laser beam machine that correspond to the circuit to be manufactured.

As semiconductor technology advances, the circuits grow smaller and smaller until a wide variety of physical effects come into play, affecting the accuracy of lines drawn by the e-beam machine. Imagine trying to draw a series of progressively narrower lines with a can of spray paint and stencils. To provide an idea of the dimensions that are involved, the lines in a sample circuit (on photomasks currently in production) are approximately 100 nanometers wide; in contrast, the width of the finest human hair is approximately 20,000 nanometers. In order to observe and measure the lines on the photomask, it is necessary to use scanning electron microscopes (SEM).

As the lines narrow, many conditions governed by physics and chemistry will affect the patterns drawn on the photomasks. Some of these degradation effects that result include, for example:

Electron scattering: where the scattering of electrons from the e-beam itself blurs the patterns on the photomasks;

Light scattering: where the scattering of photons from the laser beam itself blurs the patterns on the photomasks;

Heating effect: where the heat on the resist (into which the electron beam writes) affects the patterns on the photomasks.

Thus, it is no longer possible to simply assume that intended circuit shapes will be drawn accurately on the photomask by the e-beam mask writer machines. Instead, the manufacturing parameters for the intended circuit shapes must be adjusted to account for the characteristics of the photomask manufacturing process, in order to be manufactured correctly.

To specify parameters for semiconductor production, scanning electron microscope pictures (known as SEM images) of experimental circuits on photomasks are taken. To quantify the effects and accuracy of the photomasks, measurements (known as "metrology") are derived from these SEM images.

These measurements are used to build a model through mathematical and statistical methods. The model is then used to predict possible problems and account for these problems by modifying/correcting the circuit to be drawn.

The building of such mathematical and statistical models is a very complex process that often requires extensive and time-consuming effort by several engineers and/or statisticians. This model building process has several drawbacks, including, for example: requiring a very large amount of effort which can take extensive time for experienced model-builders (engineers and statisticians); and the mathematical and statistical methods are implemented as software tools. These tools are limited by their own feature sets. New photomask effects that require new mathematical methods to model are often beyond the scope of existing software tools. Deriving the measurements from SEM images is a complex and costly task that frequently requires an experienced engineer.

Current photomask manufacturing process modeling is described below.

First of all, the purpose of a model for the photomask manufacturing process is to predict how a particular circuit shape will appear in a given photomask manufacturing process. To illustrate this, consider FIGS. 1a-1c. FIG. 1a illustrates intended circuit shapes; FIG. 1b illustrates actual circuit shape on photomask as an SEM image; and FIG. 1c shows predicted photomask circuit shapes after using a model to simulate the intended circuit shapes. Notice that the predicted photomask circuit shapes deviate significantly from the intended shape. FIGS. 2a-2b show how a model predicts what the intended circuit shape would look like on the photomask. FIG. 2a shows intended circuit shapes before adjustment/correction (adjustments/corrections to accommodate predicted deficiencies of the photomask manufacturing process); and FIG. 2b shows the intended circuit shapes after adjusting for issues predicted by photomask model. By modeling the photomask manufacturing process, the problems with an arbitrary circuit shape on photomask can be predicted. This in turn allows the circuit shape to be adjusted (or "corrected") so that the shape can be manufactured correctly.

Modeling the characteristics of e-beam photomask manufacturing accurately is therefore critical to manufacturing semiconductors at ever shrinking technology nodes.

Methods of modeling photomask manufacturing can be outlined in the following steps:

Step #1: Designing Test Patterns: Experimental layouts are created; these experimental layouts (also known as "test-patterns") are purposefully designed to quantify the characteristics of a photomask manufacturing process. As part of the design process, gauge points are provided to measure the result of the photomask manufacturing process.

Step #2: Manufacturing Test Patterns: The test patterns from Step #1 are manufactured on a photomask via the photomask manufacturing process that is to be modeled.

Step #3: Inspecting the Test Patterns Photomask: The photomask from Step #2 is inspected via scanning electronic microscope (SEM). SEM images around the gauge points from Step #1 are taken.

Step #4: Measuring the Test Patterns Photomask: From the SEM images of the gauge points, measurements are taken. In cases where the measurements are insufficient, prior steps might have to be repeated. For example, a poor SEM image might require a gauge point to be inspected again and a new SEM image taken. In the worst case, where unforeseen effects appear, different test patterns might have to be developed as in Step #1 and undergo the same process.

Step #5: Model-building: Using the measurements from Step #4 and software tools that encapsulate statistical and mathematical methods, model builders create a mathematical model of the photomask manufacturing process.

The problems with current modeling for a photomask manufacturing process is that it is both expensive and time consuming. For example, it is not unusual for a team of multiple engineers to spend more extensive time handling the various tasks associated with modeling a photomask manufacturing process.

The process is also difficult to scale, as it takes considerable time to bring a new model-builder up to speed.

There is the need for a more accurate and more efficient way to form the mask correction file.

SUMMARY

Embodiments of the disclosure provide an image-based Artificial Neural Networks (ANN) used for a variety of applications, including tagging social media pictures with keywords, hand writing recognition, and even facial recognition in smart-phone cameras.

An image-based Artificial Neural Networks (ANN) method for modeling a photomask in manufacturing a semiconductor chip is disclosed according to one embodiment. The method may comprise: performing a training phase using a first circuit of the photomask, which comprises: providing the first circuit layout data; converting the first circuit layout data into a first circuit image in pixel form; providing a first existing SEM image taken from the first circuit on the photomask; wherein the training phase further comprises a plurality of iterations to build an image-based ANNs model; and performing a test phase using a second circuit of the photomask, which includes: providing the second circuit layout data; converting the second circuit layout data into a second circuit image in pixel form; providing a second existing SEM image taken from the second circuit on the photomask; building an image-based ANN model; verifying if the image-based ANN generates errors smaller than the predetermined value on the second circuit image; repeating the training phase if the errors are larger than the predetermined value; completing the image-based ANN modeling of the second circuit image if the errors are smaller than the predetermined value; and updating the completed second circuit image in pixel form to circuit layout data for photomask writing.

More specifically, the training phase may comprise a plurality of iterations, each comprising: feeding the first circuit image into the image-based ANN model to output a first predicted photomask image, comparing the first predicted photomask image with the existing first SEM image to output a difference; modifying the image-based ANN model based on the difference; and repeating the feeding, comparing and modifying until the difference is smaller than a predetermined value.

Also more specifically, the testing phase may comprise: feeding the second circuit image into the image-based ANN model to output a second predicted photomask image; comparing the second predicted photomask image with the second existing SEM image to output a difference; and verifying if the image-based ANN model generates errors smaller than the predetermined value.

Certain embodiments are directed to an image-based Artificial Neural Networks (ANN) method for modeling a photomask in manufacturing a semiconductor chip, comprising: training an ANN model based at least in part on first circuit layout data relating to a first circuit and first Scanning Electron Microscope (SEM) image data relating to the first circuit on the photomask; building, via the ANN model, second image data relating to a second circuit based at least in part on second circuit layout data relating to the second circuit; and updating the second circuit layout data based at least in part on the second image data, for photomask writing.

In various embodiments, training the ANN model comprises: receiving the first circuit layout data in vector form; converting the first circuit layout data into pixel form; receiving the first SEM image data relating to the first circuit in pixel form; and building the ANN model based at least in part on the first circuit layout data provided in pixel form and the first SEM image data.

In various embodiments, building the ANN model comprises iterating a process of: providing the first circuit layout data in pixel form to the ANN model to output a first predicted photomask image; comparing the first predicted photomask image with the existing first SEM image to output a difference; and modifying the image-based ANN model based on the difference. Moreover, the method may further comprise testing the ANN model based at least in part on the second circuit by: feeding the second circuit image into the image-based ANN model to output a second predicted photomask image; comparing the second predicted photomask image with a second SEM image relating to the second circuit to output a difference; and verifying if the image-based ANN model generates errors smaller than a predetermined value. In certain embodiments, the second circuit is different from the first circuit. In other embodiments, the second circuit and the first circuit are located in different portions of the photomask. Moreover, iterating may comprise executing at least one convolution module, at least one rectifier module, and at least one data collecting module. In certain embodiments, the photomask is fabricated by one of: e-beam writing, laser-beam writing, or ion-beam writing.

Certain embodiments are directed to a computer system for modeling a photomask in manufacturing a semiconductor chip. The computer system may comprise: one or more memory storage areas; and one or more processors collectively configured to: train an Artificial Neural Networks (ANN) model based at least in part on first circuit layout data relating to a first circuit and first Scanning Electron Microscope (SEM) image data relating to the first circuit on the photomask; execute the ANN model to build second image data relating to a second circuit based at least in part on second circuit layout data relating to the second circuit; and store updated second circuit layout data generated based at least in part on the second image data, for photomask writing.

In certain embodiments, storing updated second circuit layout data comprises: converting the second image data relating to the second circuit into vector form; and updating the second circuit layout data to store the updated second circuit layout data in vector form.

In various embodiments, training the ANN model comprises: receiving the first circuit layout data in vector form; converting the first circuit layout data into pixel form; receiving the first SEM image data relating to the first circuit in pixel form; and training the ANN model based at least in part on the first circuit layout data provided in pixel form and the first SEM image data.

In certain embodiments, training the ANN model comprises iterating a process of: providing the first circuit layout data in pixel form to the ANN model to output a first predicted photomask image; comparing the first predicted photomask image with the existing first SEM image to output a difference; and modifying the image-based ANN model based on the difference.

In certain embodiments, the one or more processors are further configured to test the ANN model based at least in part on the second circuit by: feeding the second circuit image into the image-based ANN model to output a second predicted photomask image; comparing the second predicted photomask image with a second SEM image relating to the second circuit to output a difference; and verifying if the image-based ANN model generates errors smaller than a predetermined value. Moreover, the second circuit may be different from the first circuit. In other embodiments, the second circuit and the first circuit may be located in different portions of the photomask.

Certain embodiments are directed to a computer program product comprising a non-transitory computer readable medium having computer program instructions stored therein, the computer program instructions when executed by a processor, cause the processor to: train an Artificial Neural Networks (ANN) model based at least in part on first circuit layout data relating to a first circuit and first Scanning Electron Microscope (SEM) image data relating to the first circuit on the photomask; execute the ANN model to build second image data relating to a second circuit based at least in part on second circuit layout data relating to the second circuit; and store updated second circuit layout data generated based at least in part on the second image data, for photomask writing.

In certain embodiments, storing updated second circuit layout data comprises: converting the second image data relating to the second circuit into vector form; and updating the second circuit layout data to store the updated second circuit layout data in vector form. In various embodiments, training the ANN model comprises: receiving the first circuit layout data in vector form; converting the first circuit layout data into pixel form; receiving the first SEM image data relating to the first circuit in pixel form; and training the ANN model based at least in part on the first circuit layout data provided in pixel form and the first SEM image data.

In certain embodiments, training the ANN model comprises iterating a process of: providing the first circuit layout data in pixel form to the ANN model to output a first predicted photomask image; comparing the first predicted photomask image with the existing first SEM image to output a difference; and modifying the image-based ANN model based on the difference.

In various embodiments, the computer program product further comprises executable portions configured to test the ANN model based at least in part on the second circuit by: feeding the second circuit image into the image-based ANN model to output a second predicted photomask image; comparing the second predicted photomask image with a second SEM image relating to the second circuit to output a difference; and verifying if the image-based ANN model generates errors smaller than a predetermined value.

This Summary does not attempt to provide the complete significance of any particular innovation, embodiment, or example as it can be used in commerce. Additionally, this Summary is not intended to signify key or critical elements of an innovation, embodiment or example or to limit the scope of the subject matter of this disclosure.

BRIEF DESCRIPTION OF DRAWINGS

A brief description of the Figures is listed below.

FIGS. 1a, 1b, and 1c depict circuit patterns from traditional photomask manufacturing.

FIGS. 2a and 2b show circuit patterns before and after adjustment based on a model from traditional photomask manufacturing.

DETAILED DESCRIPTION

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to provide a thorough understanding of one or more of the exemplary innovations, embodiments and/or examples. In the interest of not obscuring the presentation of the exemplary innovations, embodiments and/or examples in the following Detailed Description, some processing steps or operations that are known in the art may have been combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. The following description is instead focused on the distinctive features or elements of various exemplary innovations, embodiments and/or examples. Furthermore, while this description may refer to some components of the structure in the singular tense, more than one component may be depicted throughout the Figures and like components are labeled with like numerals.

Image-based Artificial Neural Networks (ANN) are used for a variety of applications, including tagging social media pictures with keywords, hand writing recognition, and even facial recognition in smart-phone cameras.

Figure 3:
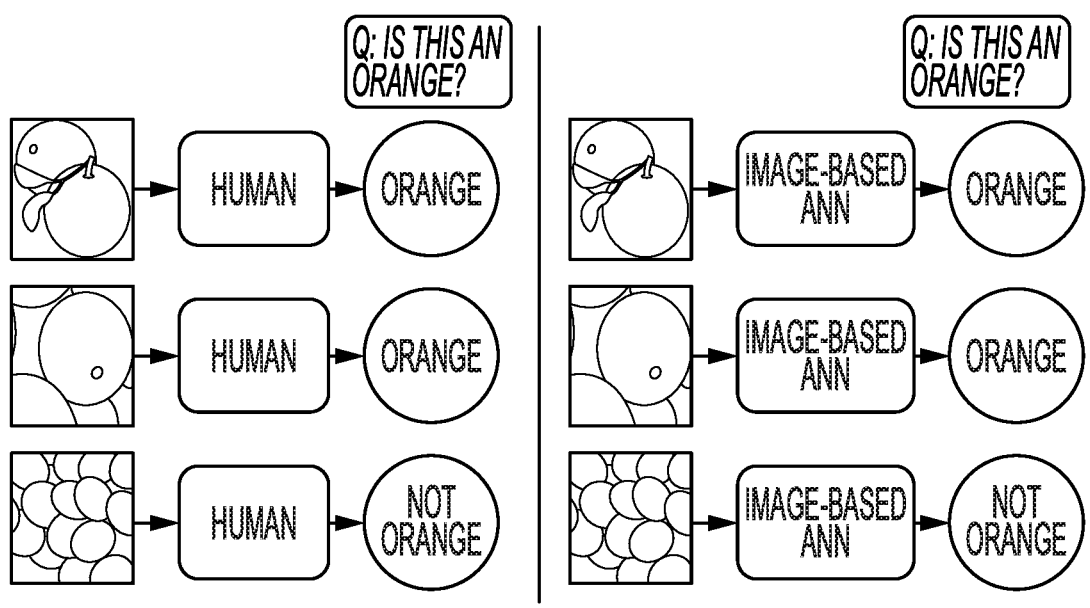
FIG. 3 depicts training of an ANN used for classifying objects in an image.

Conventional image-tagging techniques utilize neural networks in image-tagging trained to classify an object in an image. The resulting trained network is used to answer simple questions or associate keywords with the image, as depicted in FIG. 3. A simple example of image-based ANN is like a human analog for answering a simple question. In this case, the image-based ANN is trained to pick out salient features in an image to answer a question such as "Is this an orange?"

Referring to FIG. 3, one can see how image-based ANN can be utilized to solve problems, such as tagging whether an image contains all pictures that contains an orange.

Figure 4:
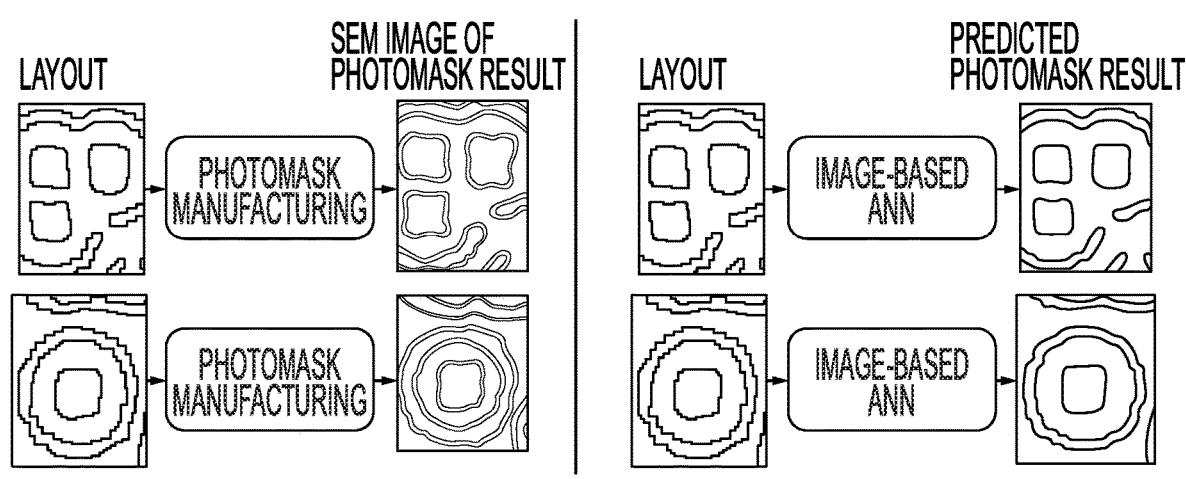
FIG. 4 depicts training of an ANN to predict the manufactured result of a circuit on a photomask as an image according to an embodiment of the disclosure.

In contrast, with some of the embodiments disclosed herein, image-based neural networks may be trained for modeling photomask manufacturing instead of being used for keyword association or to answer simple questions. Rather, for some of the embodiments disclosed herein, given a particular circuit layout and the photomask manufacturing process that is being modeled, the neural network may be used to predict what the circuit looks like on the photomask in the form of images, as depicted in FIG. 4, showing the complex use of image-based ANN as an analog for photomask manufacturing and SEM imaging. Given a layout, an image-based ANN may be trained to predict what the manufactured result would look like. From these images, problematic areas can be identified where the manufacturing process is predicted to cause a fault in the circuit, and such problematic areas can be fixed during a design phase of the photomask.

With some of the embodiments disclosed herein, the image-based ANN can use SEM images directly as input, reducing the need to derive measurements from original SEM images, saving much time in the modeling process.

With some of the embodiments disclosed herein, the image-based ANN impose no inherent limitation on the mathematical or statistical effects to be modeled, allowing modeling of unforeseen effects, eliminating the need to update the mathematical or statistical parameters.

With some of the embodiments disclosed herein, the image-based ANN that are used are self-learning modeling systems, greatly reducing the time to build the photomask models.

One such embodiment is disclosed below.

For the following exemplary embodiment, a training phase for the ANN is enabled, where the ANN is provided feedback so that it reaches optimal processing capability. This is followed by an evaluation phase, where the ANN is applied during runtime conditions.

Setup/Training Phase for an Image-based ANN

Figure 5:
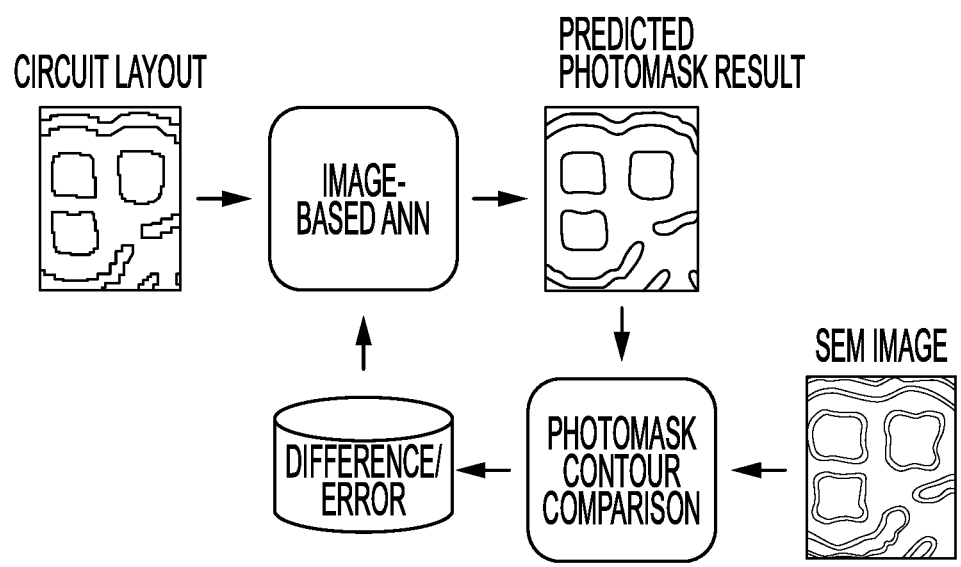
FIG. 5 depicts a flowchart for the setup/training phase of building an image-based ANN model, according to an embodiment of the disclosure.

The setup or training phase may be an iterative process, represented in FIG. 5, which depicts a flow diagram of the setup/training phase of the image-based ANN. Data indicative of differences/errors between the prediction of a current iteration and the prediction of a prior iteration is fed back into the image-based ANN. In each iteration, the image-based ANN is fed a set of layouts which are manufactured on a given photomask process (the process that is to be modeled), as well as data indicative of errors from a prior iteration of the image-based ANN prediction. The image-based ANN then uses this input to generate a new prediction. The prediction is compared against results of the photomask manufacturing processing and errors on the prediction are derived. The process may be repeated.

This process is illustrated in the following example processes:

Converting Circuit Layout into Image

Figure 6:
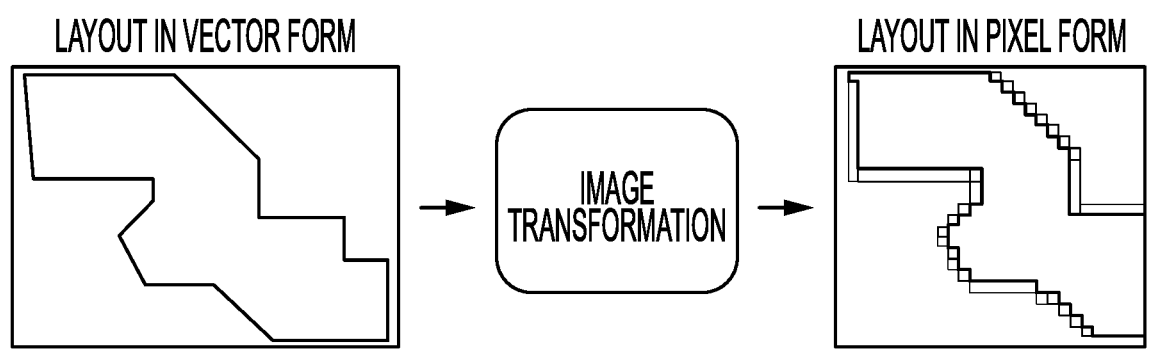
FIG. 6 depicts conversion of EDA layout shapes to pixel form, according to an embodiment of the disclosure.

Typically, as depicted in FIG. 6, a layout shape is converted from vector form into an image in pixel form to compare differences between the layout shape and the actual, generated layout. Typically, circuit layout data structures are not in a form that can be readily used by an image-based ANN, which is generally configured to input images in pixel-based formats (e.g., bitmaps). In such embodiments, layout shapes need to be converted from vector form into an image in pixel form to enable input into an image-based ANN. Conversely, circuit layouts are often generated and represented in vector form in file formats such as GDSII or OASIS. Therefore, in order for circuit layouts to be fed into an image-based ANN, the layout is transformed into the image/pixel domain.

Configuring the Layers of the Image-Based ANN Model

An image-based ANN consists of filtering and processing layers. These layers help the image-based ANN to identify the salient features of an image and learn them. There are a wide variety of filtering and processing layers possible for image-based ANN. The exemplary embodiment focuses on the following layer types:

Convolution layers: images are sampled at different rates and aggregated;

Rectifier layers: pixel values are clamped via a ramp function;

Pooling layers: pixel values are picked based on maximums;

Fully Connected layers: values of the final prediction are computed.

Figure 7:
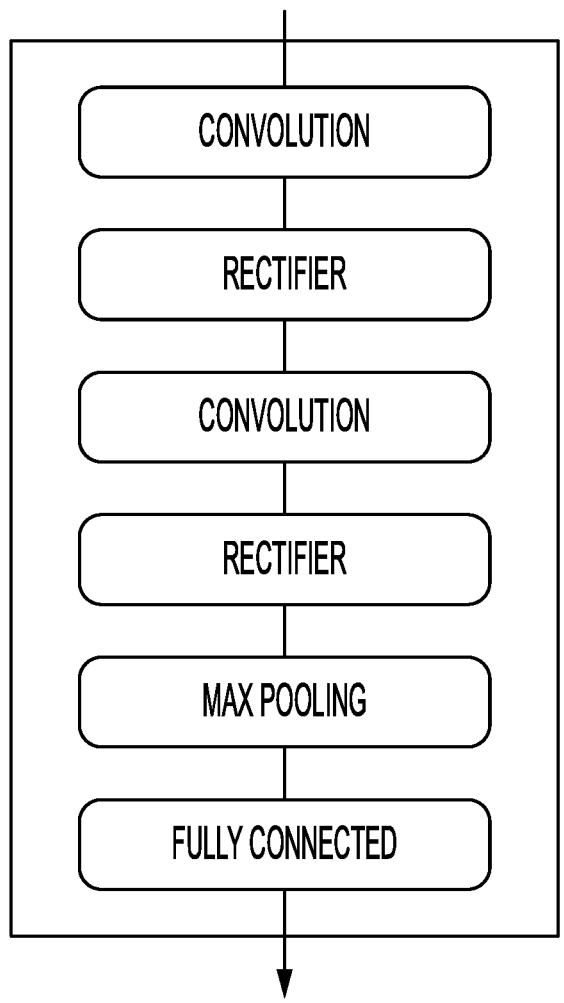
FIG. 7 depicts the processing layers of an image-based ANN model, according to an embodiment of the disclosure.

FIG. 7 depicts the high level overview of the filtering and processing layers configured for the image-based ANN in the exemplary embodiment. The image-based ANN may comprise multiple convolution and rectifier layers to identify salient features of a transformed image of circuit layout. Once the image-based ANN is configured, it is trained on a select set of circuit layouts. In each iteration, the ANN is fed the same selected set of circuit layouts and the error/difference from the prior iteration's prediction. The training may be terminated after a pre-determined number of iterations (e.g., after approximately 100,000 iterations) and/or otherwise upon identifying little noticeable difference between consecutive iterations. For example, various embodiments may compare results between consecutive iterations by comparing root-mean-square (RMS) values between consecutive iterations. The RMS values may be calculated based at least in part on uniformly spaced sample points placed on a reference contour. The training may be terminated upon calculating a value indicative of the difference between consecutive iterations as satisfying a pre-defined criteria (e.g., being below a defined threshold) and/or upon determining that the RMS value of a particular iteration satisfies a particular threshold (e.g., being below a defined threshold). The resulting post-training image-based ANN is the model of the photomask manufacturing process. The image-based ANN model may then undergo validation procedures to ensure that its predictions are sufficiently close to the actual results of the photomask manufacturing process.

In certain embodiments, the training of the image-based ANN model of the photomask manufacturing process can take less than a day.

Validating the Image-Based ANN Model

Figure 8:
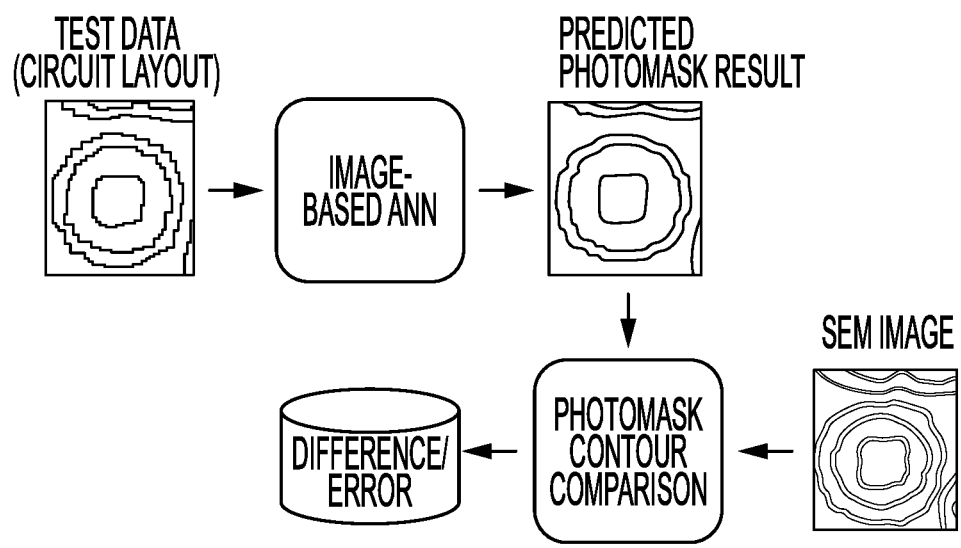
FIG. 8 depicts a flowchart for the evaluation phase of building an image-based ANN model according to an embodiment of the disclosure.

FIG. 8 depicts a validation procedure for the image-based ANN as a model for photomask manufacturing process. Test data may comprise a circuit layout that image-based ANN did not encounter during the setup/training phase. After the test data is fed into the image-based ANN as input, the resulting prediction generated by the ANN model may be compared with actual photomask manufacturing results (e.g., an SEM image of a manufactured photomask). A second set of circuit layout data may be used as test data for validating the ANN model. This data indicative of the second set of circuit layouts may be selected to encompass circuit layouts not encountered by the ANN model during the setup/training phase, such that the image-based ANN model may be validated as an analog for the photomask manufacturing process. In other words, the validation process may be performed to determine the accuracy of the ANN model in predicting manufacturing results for circuit layouts not previously utilized during the setup/training phase.

The validation procedure may be similar to the setup/training procedure for the image-based ANN. To validate the image-based ANN, a set of test data of circuit layouts is fed to the image-based ANN as input. Test data may comprise a circuit layout that the image-based ANN did not encounter during the setup/training phase. After the test data is fed into the image-based ANN as input, the resulting prediction generated by the ANN model may be compared with actual photomask manufacturing results. The image-based ANN generates a prediction of what the layout will look like on the photomask. The prediction is compared against SEM images from an actual photomask manufacturing process to determine differences therebetween by comparing RMS values calculated for the predication against SEM image (e.g., generated based on uniformly spaced sample points on a reference contour of the within the photomask. If the differences/errors are small (e.g., the RMS value is below a defined value), then the image-based ANN is an effective model of the photomask manufacturing process.

In certain embodiments, data indicative of the differences/errors between prediction and actual results are not fed back into the image-based ANN during validation.

Figure 9:
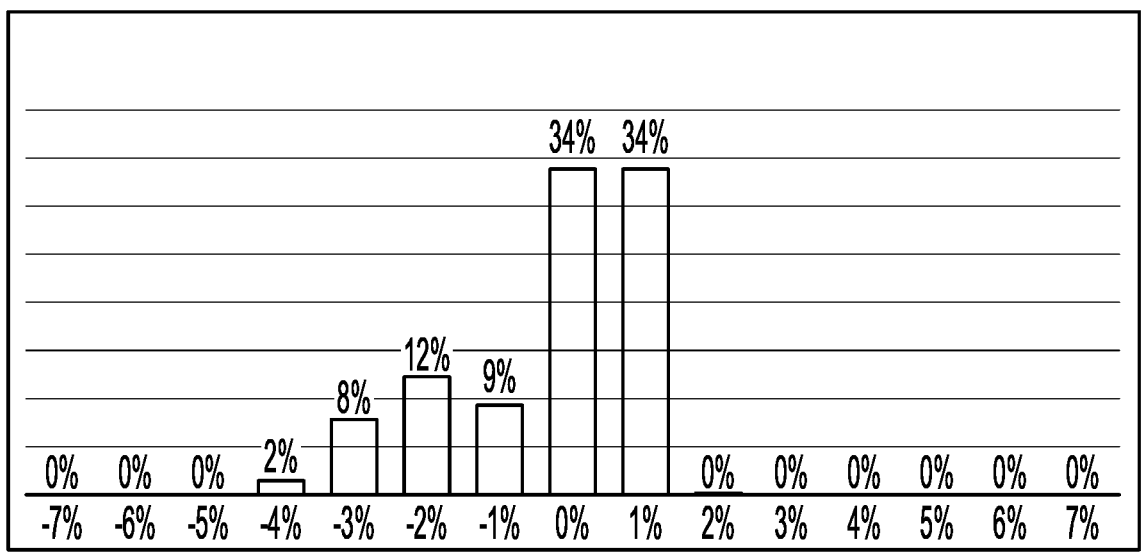
FIG. 9 depicts a histogram of errors from one trained ANN model.

Moreover, certain embodiments are configured for analysis of circuit layouts that have undergone heavy inverse lithography technology (ILT) processing. FIG. 9 shows a histogram of differences (expressed in percentage) in predicted intensity from the image-based ANN versus the true intensity from SEM images of example circuit layouts. In computing the histogram of prediction error, the intensity from the prediction and the SEM image are sampled. The difference (prediction minus real) is bucketed into percentages and charted in FIG. 9.

FIG. 9 shows that the image-based ANN provides high accuracy in the prediction for this test-case. All of the calculated deviations in the example data are between +5% to −5% of intensity, with approximately ninety percent of the predictions within −2% to +2% of the SEM image value.

FIGS. 10-13 are simplified block diagrams of a computer system and components suitable for use with embodiments of the technology, as well as circuit design and circuit embodiments of the technology.

Figure 10:
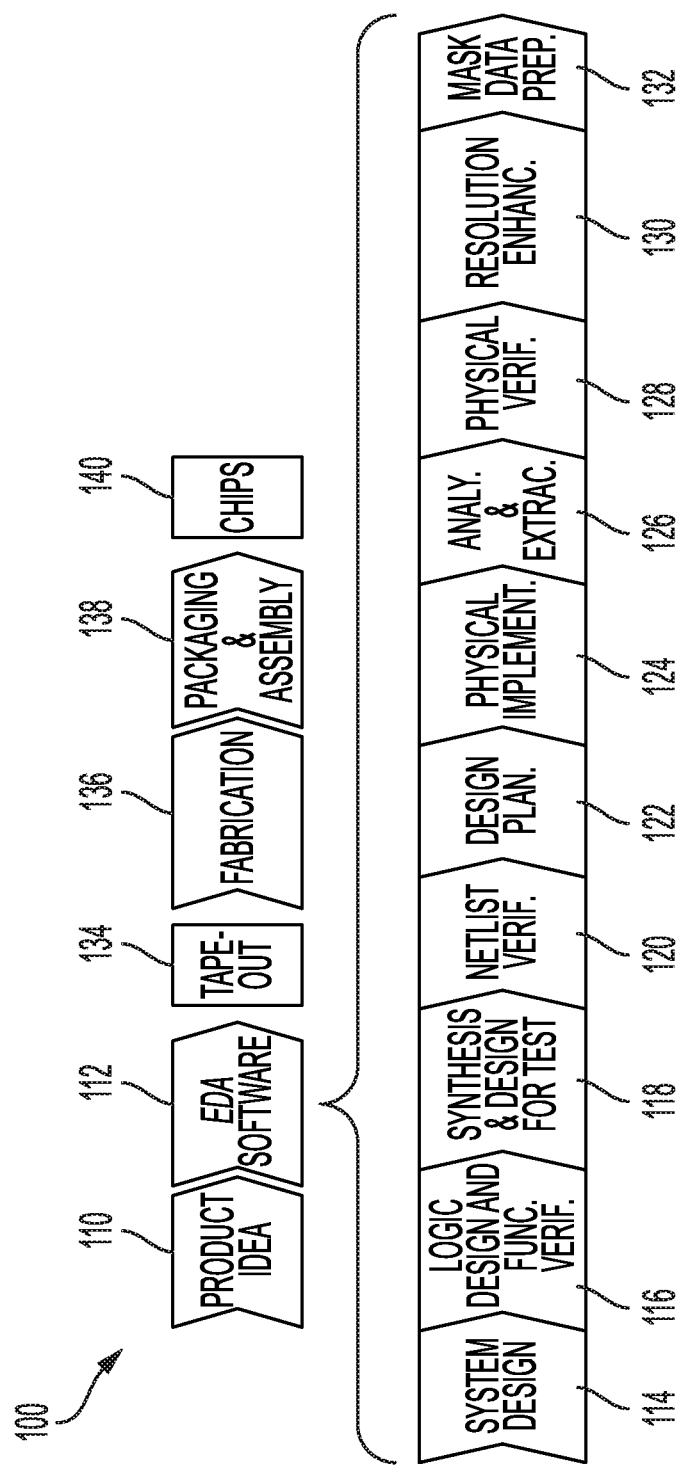
FIG. 10 depicts a flowchart illustrating various operations in the design and fabrication of an integrated circuit in accordance with an embodiment of the present disclosure.

FIG. 10 depicts a flowchart illustrating various operations in the design and fabrication of an integrated circuit in accordance with an embodiment of the present disclosure.

FIG. 10 also illustrates various processes performed in the design 100, verification and fabrication of an item of manufacture such as an integrated circuit using software tools with a computer, and possibly special hardware-assisted tools, to transform and verify design data and instructions that represent the integrated circuit. These processes start with the generation of a product idea 110 with information supplied by a designer, information which is transformed during a process to create an item of manufacture (referred to herein as a design or device) that uses EDA software tools 112, which may also be signified herein as EDA software, as a design tool or a verification tool. When the design is finalized, it can be taped-out 134, which typically is when artwork for the integrated circuit is sent to a fabrication facility. After tape-out, a semiconductor die is fabricated 136 and packaging and assembly processes 138 are performed, which result in the finished integrated circuit 140 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language (HDL) such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, much used detailed descriptions of analog-based circuits.

A design process that uses EDA software tools 112 includes tasks 114-132, which are described below. This design flow description is for illustration purposes only and is not meant to limit the present disclosure. For example, an actual integrated circuit design may require a designer to perform the design operations in a different sequence than the sequence described herein.

During system design 114, a designer describes the functionality to be manufactured. The designer can also perform what-if planning to refine the functionality and to check costs. Note that hardware-software architecture partitioning can occur at this stage.

During logic design and functional verification 116, modules in the circuit are specified in one or more hardware description languages, or HDLs, and the design in HDL is checked for functional accuracy. More specifically, the design is checked to ensure that it produces the correct outputs. Exemplary HDL languages are Verilog, VHDL and System C. Functional verification is typically done by using software-based simulators and other tools such as test bench generators, static HDL checking tools and formal verification tools. In some situations, special hardware referred to as 'emulators' or 'prototyping systems' are used to speed up the functional verification.

During synthesis and design for test 118, VHDL/Verilog code is translated to a netlist. This netlist can be optimized for the target technology. Additionally, tests can be designed and implemented to check the finished integrated circuit.

During netlist verification 120, the netlist is checked for compliance with timing constraints and for correspondence with the VHDL/Verilog code.

During design planning 122, an overall floor plan for the integrated circuit is constructed and analyzed for timing and top-level routing using EDA tools.

During layout implementation 124, the placement (positioning of circuit elements such as transistors or capacitors) and routing (connection of the same by a plurality of conductors) occurs.

During analysis and extraction 126, the circuit function is verified at the layout level, which permits refinement of the layout design.

During physical verification 128, the layout design is checked to ensure correctness for manufacturing constraints such as DRC constraints, electrical constraints, lithographic constraints, and circuitry function matching the HDL design specification.

During resolution enhancement 130, geometric manipulations of the layout are performed to improve manufacturability of the design.

During mask-data preparation 132, the 'tape-out' data for production of masks to produce finished integrated circuits is provided.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 112.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

Figure 11:
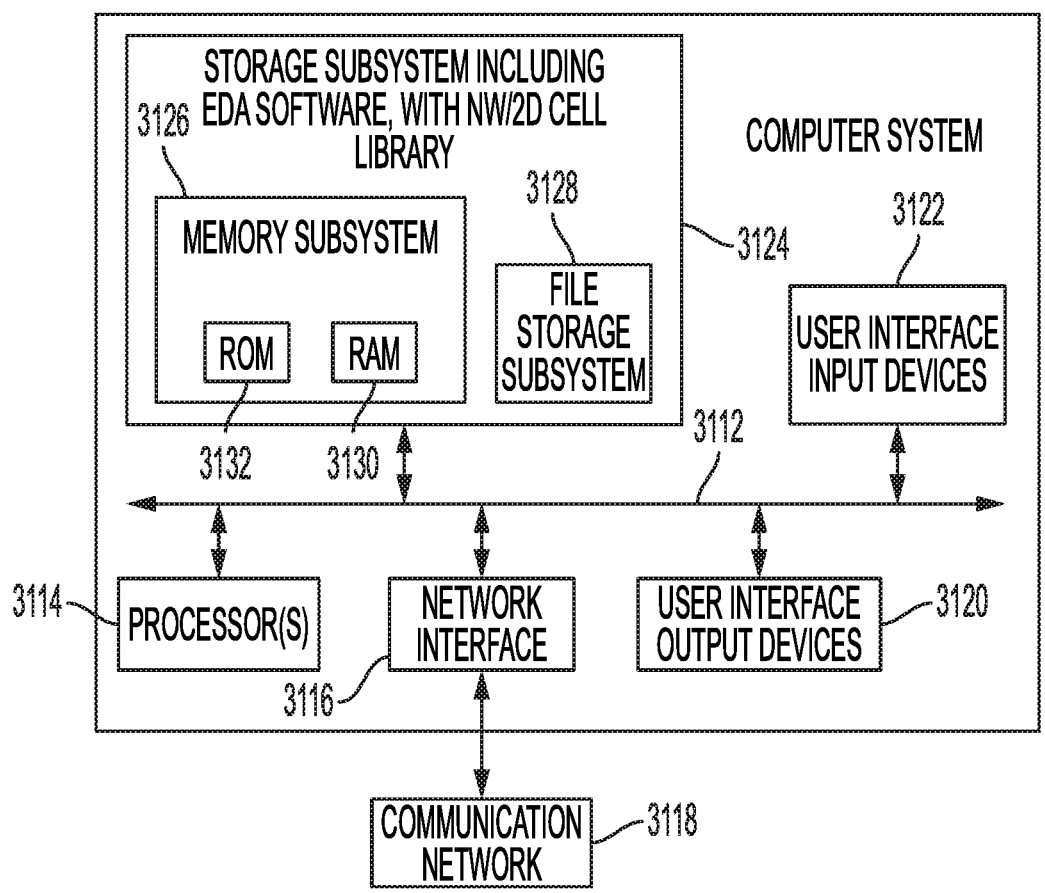
FIG. 11 depicts a simplified block diagrams of a computer system suitable for use with the disclosed ANN technology.

FIG. 11 depicts a simplified block diagrams of a computer system suitable for use with the disclosed ANN technology.

Figure 12:
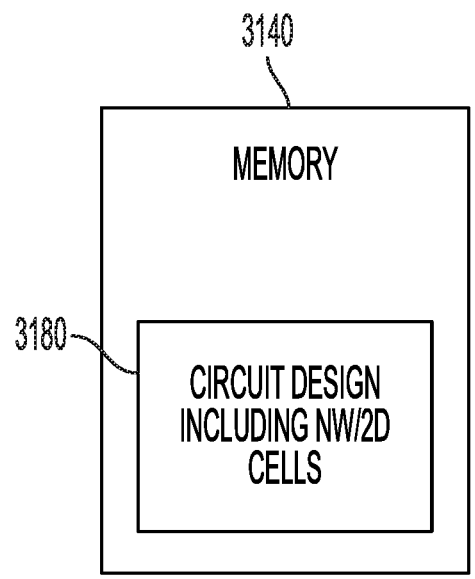
FIG. 12 depicts the memory subsystem embodiment in FIG. 11.

FIG. 12 depicts the memory subsystem embodiment in FIG. 11.

Figure 13:
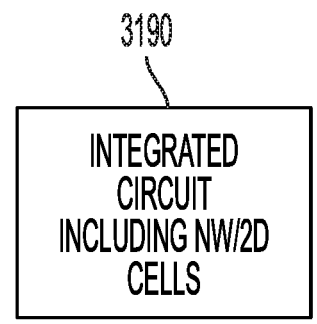
FIG. 13 depicts the circuit design embodiment in FIG. 12.

FIG. 13 depicts the circuit design embodiment in FIG. 12.

Computer system 3124 typically includes at least one computer or processor 3114 which communicates with a number of peripheral devices via bus subsystem 3112. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms 'processor' and 'computer' are further defined below. These peripheral devices may include a storage subsystem 3124, comprising a memory subsystem 3126 and a file storage subsystem 3128, user interface input devices 3122, user interface output devices 3120, and a network interface subsystem 3116. The input and output devices allow user interaction with computer system 3110.

The computer system may be a server computer, a client computer, a workstation, a mainframe, a personal computer (PC), a tablet PC, a set-top box (STB), a personal digital assistant (PDA), a cellular telephone, a smartphone, a web appliance, a kiosk, a television, a game station, a network router, switch or bridge, or any data processing machine capable of executing instructions 124 (sequential or otherwise) that specify actions to be taken by that machine. The computer system typically includes an operating system, such as Microsoft's Windows, Apple Computer's Mac OS, Linux or Unix.

Innovations, embodiments and/or examples of the claimed inventions are neither limited to conventional computer applications nor the programmable apparatus that run them. For example, the innovations, embodiments and/or examples of the claimed inventions can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multiprocessor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions 124 to perform any one or more of the sets of instructions discussed herein. Due to the ever-changing nature of computers and networks, the description of computer system 3110 depicted in FIG. 11 is intended only as one example for purposes of illustrating the preferred embodiments. Many other configurations of computer system 3110 are possible having more or less components than the computer system depicted in FIG. 11.

Network interface subsystem 3116 provides an interface to outside networks, including an interface to communication network 3118, and is coupled via communication network 3118 to corresponding interface devices in other computer systems or machines. Communication network 3118 may comprise many interconnected computer systems, machines and communication links. These communication links may be wireline links, optical links, wireless links, or any other devices for communication of information. Communication network 3118 can be any suitable computer network, for example a wide area network such as the Internet, and/or a local area network such as Ethernet. The communication network can be wired and/or wireless, and the communication network can use encryption and decryption methods, such as is available with a virtual private network.

User interface input devices 3122 may include an alpha-numeric keyboard, pointing devices such as a mouse, trackball, touchpad, stylus, or graphics tablet, a scanner, a touch-screen incorporated into the display, audio input devices such as voice recognition systems, microphones, and other types of input devices. In general, use of the term "input device" is intended to include all possible types of devices and ways to input information into computer system 3110 or onto communication network 3118.

User interface output devices 3120 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 3110 to the user or to another machine or computer system.

Memory subsystem 3126 typically includes a number of memories including a main random-access memory (RAM) 3130 (or other volatile storage device) for storage of instructions and data during program execution and a read only memory (ROM) 3132 in which fixed instructions are stored. File storage subsystem 3128 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 3128.

Bus subsystem 3112 provides a device for letting the various components and subsystems of computer system 3110 communicate with each other as intended. Although bus subsystem 3112 is shown schematically as a single bus, alternative embodiments of the bus subsystem may use multiple busses. For example, RAM-based main memory can communicate directly with file storage systems using Direct Memory Access (DMA) systems.

FIGS. 11 and 12 show a memory 3140 such as a non-transitory, computer readable data and information storage medium associated with file storage subsystem 3128, and/or with network interface subsystem 3116, and can include a data structure specifying a circuit design. The memory 3140 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 13 is a block representing an integrated circuit 3190 created with the described technology that includes one or more cells selected, for example, from a cell library.

However, one of ordinary skill in the art will understand that the illustrated components are readily understood when viewed in context of the illustration as a whole and the accompanying disclosure describing such various figures.

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof, solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein were chosen and described to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed is:

1. A method comprising:
   training an image-based artificial neural network (ANN) model by:
      receiving first circuit layout data in vector form, wherein the first circuit layout data relates to a first circuit;
      converting the first circuit layout data into pixel form;
      receiving first Scanning Electron Microscope (SEM) image data in pixel form, wherein the first SEM image data relates to the first circuit on a photomask for a semiconductor chip; and
      building the image-based ANN model based on the first circuit layout data provided in pixel form and the first SEM image data;
   building, via the image-based ANN model, second image data relating to a second circuit based at least in part on second circuit layout data relating to the second circuit, wherein the second circuit and the first circuit are located in different portions of the photomask;
   updating the second circuit layout data based at least in part on the second image data, for photomask writing; and
   testing the image-based ANN model based at least in part on the second circuit by:
      feeding the second circuit image into the image-based ANN model to output a second predicted photomask image;
      comparing the second predicted photomask image with a second SEM image relating to the second circuit to output a difference; and
      verifying if the output difference is smaller than a defined value.

2. The method as in claim 1, wherein building the image-based ANN model comprises iterating a process of:
   providing the first circuit layout data in pixel form to the image-based ANN model to output a first predicted photomask image;
   comparing the first predicted photomask image with the existing first SEM image to output a difference; and
   modifying the image-based ANN model based on the difference.

3. The method as in claim 2, wherein iterating comprises executing at least one convolution module, at least one rectifier module, and at least one data collecting module.

4. The method as claim 1, wherein the photomask is fabricated by one of:
   e-beam writing, laser-beam writing, or ion-beam writing.

5. A computer system comprising:
   one or more memory storage areas; and
   one or more processors collectively configured to:
   train an image-based Artificial Neural Network (ANN) model by:
      receiving first circuit layout data in vector form, wherein the first circuit layout data relates to a first circuit;
      converting the first circuit layout data into pixel form;
      receiving first Scanning Electron Microscope (SEM) image data in pixel form, wherein the first SEM image data relates to the first circuit on a photomask for a semiconductor chip; and
      building the image-based ANN model based on the first circuit layout data provided in pixel form and the first SEM image data;
   execute the image-based ANN model to build second image data relating to a second circuit based at least in part on second circuit layout data relating to the second circuit, wherein the second circuit and the first circuit are located in different portions of the photomask;
   store updated second circuit layout data generated based at least in part on the second image data, for photomask writing; and
   testing the image-based ANN model based at least in part on the second circuit by:
      feeding the second circuit image into the image-based ANN model to output a second predicted photomask image;
      comparing the second predicted photomask image with a second SEM image relating to the second circuit to output a difference; and
      verifying if the output difference is smaller than a defined value.

6. The computer system of claim 5, wherein storing updated second circuit layout data comprises:
   converting the second image data relating to the second circuit into vector form; and
   updating the second circuit layout data to store the updated second circuit layout data in vector form.

7. The computer system of claim 5, wherein training the image-based ANN model comprises iterating a process of:
   providing the first circuit layout data in pixel form to the image-based ANN model to output a first predicted photomask image;
   comparing the first predicted photomask image with the existing first SEM image to output a difference; and
   modifying the image-based ANN model based on the difference.

8. A computer program product comprising a non-transitory computer readable medium having computer program instructions stored therein, the computer program instructions when executed by a processor, cause the processor to:
   train an image-based Artificial Neural Network (ANN) model by:
      receiving first circuit layout data in vector form, wherein the first circuit layout data relates to a first circuit;
      converting the first circuit layout data into pixel form;
      receiving first Scanning Electron Microscope (SEM) image data in pixel form, wherein the first SEM image data relates to the first circuit on a photomask for a semiconductor chip; and
      building the image-based ANN model based on the first circuit layout data provided in pixel form and the first SEM image data;
   execute the image-based ANN model to build second image data relating to a second circuit based at least in part on second circuit layout data relating to the second circuit, wherein the second circuit and the first circuit are located in different portions of the photomask;
   store updated second circuit layout data generated based at least in part on the second image data, for photomask writing; and
   testing the image-based ANN model based at least in part on the second circuit by:
      feeding the second circuit image into the image-based ANN model to output a second predicted photomask image;
      comparing the second predicted photomask image with a second SEM image relating to the second circuit to output a difference; and
      verifying if the output difference is smaller than a defined value.

9. The computer program product of claim 8, wherein storing updated second circuit layout data comprises:
   converting the second image data relating to the second circuit into vector form; and
   updating the second circuit layout data to store the updated second circuit layout data in vector form.

10. The computer program product of claim 8, wherein training the image-based ANN model comprises iterating a process of:
    providing the first circuit layout data in pixel form to the image-based ANN model to output a first predicted photomask image;
    comparing the first predicted photomask image with the existing first SEM image to output a difference; and
    modifying the image-based ANN model based on the difference.

* * * * *